United States Patent
Haber et al.

(10) Patent No.: US 12,432,878 B2
(45) Date of Patent: Sep. 30, 2025

(54) INTERNAL RECIRCULATION COOLING MODULE

(71) Applicant: Jetcool Technologies Inc., Littleton, MA (US)

(72) Inventors: Ludwig C. Haber, Littleton, MA (US); Cameron Boggio, Littleton, MA (US); Andy La Fosse, Littleton, MA (US); David Fox, Littleton, MA (US); Robert Ballerstedt, Littleton, MA (US)

(73) Assignee: JetCool Technologies Inc., Littleton, MA (US)

( * ) Notice: Subject to any disclaimer, the term of this patent is extended or adjusted under 35 U.S.C. 154(b) by 0 days.

(21) Appl. No.: 18/777,418

(22) Filed: Jul. 18, 2024

(65) Prior Publication Data
US 2025/0031342 A1    Jan. 23, 2025

Related U.S. Application Data

(60) Provisional application No. 63/527,517, filed on Jul. 18, 2023.

(51) Int. Cl.
| | |
|---|---|
| *H05K 7/20* | (2006.01) |
| *H01L 23/473* | (2006.01) |
| *H05K 1/02* | (2006.01) |

(52) U.S. Cl.
CPC ..... *H05K 7/20254* (2013.01); *H01L 23/4735* (2013.01); *H05K 1/0203* (2013.01); *H05K 7/20272* (2013.01)

(58) Field of Classification Search
CPC ...... H05K 1/189; H05K 7/20272; H05K 1/14; H05K 7/20254; H05K 7/20345; H05K 7/20963; H05K 7/20327; H05K 7/20772; H05K 1/0203; H01L 23/4735; H01L 23/473; H01L 23/4336
See application file for complete search history.

(56) References Cited

U.S. PATENT DOCUMENTS

| | | | |
|---|---|---|---|
| 4,399,484 A * | 8/1983 | Mayer | H05K 7/20554 361/689 |
| 5,023,695 A | 6/1991 | Umezawa et al. | |
| 5,841,634 A | 11/1998 | Visser | |
| 6,366,462 B1 | 4/2002 | Chu et al. | |

(Continued)

FOREIGN PATENT DOCUMENTS

| | | |
|---|---|---|
| JP | H06349989 A | 12/1994 |
| JP | 2003051689 A | 2/2003 |

(Continued)

*Primary Examiner* — Adam B Dravininkas
(74) *Attorney, Agent, or Firm* — Grady L. White; Potomac Law Group, PLLC

(57) ABSTRACT

Improved cooling modules and methods are configured to recirculate the liquid coolant fluid inside the cooling modules so that the same liquid cooling fluid impinges the surfaces of the heat-generating electronic components (or cooling plates in thermal communication with the heat-generating electronic components) multiple times before exiting the cooling module, thereby allowing a given flow of coolant fluid to be re-used several times over. With each re-use of the coolant fluid, the flow rate demand drops, reducing infrastructure required to achieve higher performance in direct and indirect micro-convective impingement cooling applications.

21 Claims, 16 Drawing Sheets

(56) References Cited

U.S. PATENT DOCUMENTS

| | | |
|---|---|---|
| 11,191,184 B2 | 11/2021 | Mizerak et al. |
| 11,277,937 B2 | 3/2022 | Malouin et al. |
| 11,844,193 B2 | 12/2023 | Mizerak et al. |
| 11,963,341 B2 | 4/2024 | Malouin et al. |
| 12,016,157 B2 | 6/2024 | Malouin et al. |
| 12,048,118 B2 | 7/2024 | Malouin et al. |
| 12,100,643 B2 | 9/2024 | Mizerak et al. |
| 2007/0272392 A1* | 11/2007 | Ghosh ............ H01L 23/4336 257/714 |
| 2012/0063085 A1* | 3/2012 | Dede ............ F28F 3/048 165/165 |
| 2012/0170222 A1* | 7/2012 | Dede ............ F28F 3/083 165/173 |
| 2014/0190665 A1* | 7/2014 | Joshi ............ H01L 23/4735 165/104.19 |
| 2019/0013258 A1* | 1/2019 | Malouin, Jr. ......... F28D 1/0246 |
| 2020/0326025 A1 | 10/2020 | Malouin et al. |
| 2020/0350233 A1 | 11/2020 | Mizerak et al. |
| 2021/0265240 A1 | 8/2021 | Smith et al. |
| 2021/0320050 A1 | 10/2021 | Robinson et al. |
| 2022/0117115 A1 | 4/2022 | Malouin et al. |
| 2022/0230937 A1 | 7/2022 | Malouin et al. |
| 2022/0232732 A1* | 7/2022 | Alvarado ......... H05K 7/20254 |
| 2022/0408592 A1 | 12/2022 | Malouin et al. |
| 2023/0048500 A1 | 2/2023 | Malouin et al. |
| 2023/0156959 A1 | 5/2023 | Malouin et al. |
| 2023/0284416 A1 | 9/2023 | Malouin et al. |
| 2024/0090180 A1 | 3/2024 | Malouin et al. |
| 2024/0138128 A1 | 4/2024 | Malouin et al. |
| 2024/0206128 A1 | 6/2024 | Malouin et al. |

FOREIGN PATENT DOCUMENTS

| | | |
|---|---|---|
| KR | 1020210090231 A | 7/2021 |
| WO | 2005117108 A1 | 12/2005 |

* cited by examiner

INTERNAL RECIRCULATION COOLING MODULE

FIELD OF THE INVENTION

The present invention relates generally to the field of liquid cooling modules for data centers, servers, power inverters and other liquid cooling module compute assemblies, and more particularly to micro-convective jet impingement liquid cooling devices and methods.

RELATED ART

The cooling performance of direct-to-chip single phase liquid cooling (DLC) devices is typically measured in terms of heat transfer coefficients. Impingement cooling modules produce very high local heat transfer coefficients. Performance of cooling modules utilizing impingement cooling are driven by both flow rate and pressure drop. Relative to other more established cooling technologies, (e.g. microchannel), impingement cooling performs at its best when the cooling module flow rate is 2×-4× higher than established cooling technologies. There are inherent advantages in employing impingement cooling modules, even with the relatively higher flow consumption such as a more even processor temperature distribution and the absence of caloric thermal resistance, among others.

However, the existing cooling infrastructure in a given application area may be such that a 2×-4× increase in flow rate cannot be supported. Peak performance of jet impingement cooling modules can therefore not be achieved in these environments. Jet impingement modules would therefore benefit from the ability to reduce flow requirements to ensure a more optimal impingement performance is obtained, even at lower flow rates.

SUMMARY OF THE INVENTION

Embodiments of the present invention provide improved cooling modules and methods for cooling heat-generating electronic components attached to printed circuit boards found in servers and other data processing equipment. The improved cooling modules and methods are configured to recirculate the liquid coolant fluid inside the cooling modules so that the same liquid cooling fluid impinges the surfaces of the heat-generating electronic components (or cooling plates in thermal communication with the heat-generating electronic components) multiple times before exiting the cooling module, thereby allowing a given flow of coolant fluid to be re-used several times over. With each re-use of the coolant fluid, the flow rate demand drops. For example, a single recirculation of the coolant fluid in a cooling module constructed and operating in accordance with the devices and techniques described herein typically reduces the flow rate requirement of that cooling module by approximately 50% without a significant decrease in cooling performance. A triple recirculation of the coolant fluid inside the cooling module typically reduces the flow rate requirement by 67%, and so on. Beneficially, internal recirculation, implemented according to the current invention, does not increase the number of external seals required, limits pressure losses in internal manifolding and allows priority cooling areas on the chipset to be addressed first by correct staging of the impingement areas internal to the cooling module.

In general, embodiments of the present invention provide cooling modules with reduced flow demand by implementing internal recirculation of the liquid coolant fluid inside the cooling module so that the liquid coolant fluid impinges on the surfaces to be cooled multiple times before the liquid coolant fluid exits the cooling module. Internal recirculation allows the discharge fluid from a given section within the cooling module to be routed to the inlet of a second section without leaving the cooling module housing. This technique of efficiently collecting and rerouting coolant fluid that has already impinged on the cooling surface permits the bulk of the liquid coolant fluid to remain within the primary external seal boundary of the cooling module for a longer time while its cooling potential can still be put to effective use. Thus, the benefits of using embodiments of the present invention include, without limitation:

1) Allowing re-use of the coolant fluid several times, significantly cutting flow demand.
2) Efficiently routing the coolant fluid to minimize manifolding pressure drops.
3) Avoiding the additional external seal failure points and the additional pressure drops associated with externally recirculating the coolant fluid.

The coolant fluid passing through cooling modules constructed and operated according to embodiments of the present invention is internally rerouted a number of times after impingement so that it can be "re-used" multiple times to cool multiple sections of a cooling surface. The coolant fluid is also accelerated against the surface to be cooled several times using micro-convective nozzle arrays. But rather than being expelled from the cooling module after a single impingement, the coolant fluid is re-captured and re-accelerated through additional micro-convective nozzle arrays in one or more additional stages. By connecting multiple different sections of micro-convective nozzle arrays in series, the flow rate is reduced. In some embodiments the multiple different sections of nozzle arrays may be connected in series and in parallel with each other.

The devices and techniques disclosed herein may be implemented in both direct cooling modules and indirect cooling modules. Direct cooling modules apply the coolant directly to the surface of the heat source to cause heat transfer. Indirect cooling modules apply the coolant to a plate that is part of the cooling module where the plate is in thermal contact with the heat source to cause heat transfer.

In one embodiment, the invention provides a cooling module, wherein the cooling module includes a jet plate, a housing, a ceiling between the jet plate and the housing, a base plate, a fastening system and a fastening system for attaching the cooling module to a circuit board (or server) containing heat-generating electronic components. The jet plate has an upper face, a lower face, a first segment that includes a first array of microjet nozzles extending through the jet plate from the upper face of the jet plate to the lower face of the jet plate, and a second segment that includes second array of microjet nozzles extending through the jet plate from the upper face of the jet plate to the lower face of the jet plate. The ceiling disposed between the jet plate and the housing includes a first ceiling-mounted boundary extending from the ceiling to the upper face of the jet plate and a second ceiling-mounted boundary extending from the ceiling to the upper face of the jet plate. The base plate comprises a cooling surface, a first cooling surface-mounted boundary extending from the cooling surface to the lower face of the jet plate, and a second cooling surface-mounted boundary extending from the cooling surface to the lower face of the jet plate.

The jet plate, the ceiling, the cooling surface of the base plate, the first ceiling-mounted boundary, the second ceiling-mounted boundary, the first cooling surface-mounted boundary and the second cooling surface-mounted boundary are all arranged to define a first inlet plenum located between the ceiling and the first array of microjet nozzles, a second inlet plenum located between the ceiling and the second array of microjet nozzles, a first impingement volume located between the first array of microjet nozzles and the cooling surface, a second impingement volume located between the second array of microjet nozzles and the cooling surface, and a first couch passage fluidly connecting the first impingement volume to the second inlet plenum.

The fastening system, which may include screws, pins or a tensioner plate, for example, attaches the cooling module to the circuit board, which has one or more heat-generating electronic components affixed thereto. In one embodiment, the fastening system attaches the cooling module to the circuit board such that the cooling surface of the base plate will be in direct thermal communication with the one or more heat-generating electronic components on the circuit board. In this configuration, the cooling surface of the base plate is able to absorb heat generated by heat-generating electronic components while the circuit board is in operation.

The cooling module also includes an inlet fitting attached to the housing, the inlet fitting being configured to admit into the cooling module a pressurized coolant fluid transferred from an external source, such as an external pump or central distribution unit (CDU). An inlet flow channel inside the cooling module carries the pressurized coolant fluid from the inlet fitting to the first inlet plenum. When the pressurized coolant fluid coolant fluid enters the first inlet plenum, the first array of microjet nozzles in the first segment of the jet plate is configured to receive the pressurized coolant fluid from the first inlet plenum, and accelerate the pressurized coolant fluid while directing the accelerated and pressurized coolant fluid to flow into the first impingement volume below the jet plate at a high velocity to strike a first portion of the cooling surface of the base plate, thereby removing the heat that the first portion of the cooling surface has absorbed from said one or more heat-generating electronic components.

At this point, the couch passage is configured to carry some of the pressurized coolant fluid that struck the first portion of the cooling surface out of the first impingement volume and into the second inlet plenum. Then the second array of microjet nozzles in the jet plate draws the pressurized coolant fluid from the second inlet plenum, accelerates the pressurized coolant fluid, and directs the accelerated and pressurized coolant fluid to flow into the second impingement volume at high velocity to strike a second portion of the cooling surface of the base plate, thereby removing the heat that the second portion of the cooling surface has absorbed from said one or more heat-generating electronic components.

In preferred embodiments, the cooling module of the present invention also includes one or more effluent collection passages to capture some of the pressurized coolant fluid in the first and second impingement volumes and route the captured pressurized coolant fluid to an outlet fitting attached to the housing for discharge from the cooling module.

Notably, the ceiling may, or may not, be manufactured as an integral component of the housing. In some embodiments, cooling modules of the present invention may include an interstitial plate disposed between the housing and the jet plate, and the ceiling is integrated into the interstitial plate instead of the housing.

In another embodiment, the base plate of the cooling module has an opening on the bottom side, instead of a cooling surface, which permits the coolant fluid accelerated by the microjet arrays in the jet plate to impinge directly on the surfaces of the heat-generating electronic components multiple times, instead of impinging on a cooling surface in thermal contact with the heat-generating electronic components. After impingement the first time, the cooling fluid is then carried by the couch passage to a downstream inlet plenum to be accelerated and directed to impinge directly on other portions of the heat-generating for a second (third or fourth) time by a second (third or fourth) microjet nozzle array in the jet plate.

In still another embodiment, a method for cooling one or more heat-generating electronic components attached to a circuit board is provided. Step 1 in the method is providing a cooling module comprising a jet plate, a housing, a ceiling disposed between the jet plate and the housing, a base plate having a cooling surface, and a fastening system for fastening the cooling module to the circuit board. For this step, the jet plate comprises a first segment that includes a first array of microjet nozzles extending through the jet plate, and a second segment that includes second array of microjet nozzles extending through the jet plate. The jet plate, the ceiling, the cooling surface of the base plate, the first ceiling-mounted boundary, the second ceiling-mounted boundary, the first cooling surface-mounted boundary and the second cooling surface-mounted boundary are all arranged to define a first inlet plenum located between the ceiling and the first array of microjet nozzles, a second inlet plenum located between the ceiling and the second array of microjet nozzles, a first impingement volume located between the first array of microjet nozzles and the cooling surface, a second impingement volume located between the second array of microjet nozzles and the cooling surface, and a first couch passage fluidly connecting the first impingement volume to the second inlet plenum.

Step 2 is using the fastening system to attach the cooling module to the circuit board so that the cooling surface of the base plate will be in thermal communication with said one or more heat-generating electronic components on the circuit board and absorbs heat generated by said one or more heat-generating electronic components while the circuit board is in operation. Step 3 of the method is connecting an external source for pressurized coolant fluid to an inlet port on the housing of the cooling module. Step 4 is transmitting pressurized coolant fluid received at the inlet port into the first inlet plenum of the jet plate.

In step 5, the first array of microjet nozzles in the first segment of the jet plate receives the pressurized cooling fluid from the first inlet plenum, accelerates the pressurized coolant fluid and directs the accelerated and pressurized coolant fluid to flow into the first impingement volume at high velocity to strike a first portion of the cooling surface of the base plate, thereby removing the heat that the first portion of the cooling surface has absorbed from said one or more heat-generating electronic components. Typically, but not necessarily, the coolant leaves via the boundaries of the impingement volume. In step 6, the couch passage in the cooling module transmits at least some of the pressurized coolant fluid that struck the first portion of the cooling surface from the first impingement volume to the second inlet plenum. And finally, in step 6, the second array of microjet nozzles in the jet plate receives the pressurized coolant fluid from the second inlet plenum, accelerates the pressurized coolant fluid and then directs the accelerated and pressurized coolant fluid to flow into the second impingement volume at high velocity to strike a second portion of the cooling surface of the base plate, without permitting the pressurized coolant fluid to exit the cooling module before entering the second inlet plenum, thereby removing the heat that the second portion of the cooling surface has absorbed from said one or more heat-generating electronic components.

BRIEF DESCRIPTION OF THE FIGURES

The accompanying drawings, which are incorporated in and constitute part of the specification, illustrate preferred embodiments of the invention, and, together with the description, serve to explain the principles of the present invention. In the drawings, like reference numbers indicate identical or functionally similar elements. Additionally, the left-most digit(s) of a reference number identifies the drawing in which the reference number first appears.

DETAILED DESCRIPTION OF THE EXEMPLARY EMBODIMENTS

Figure 1:
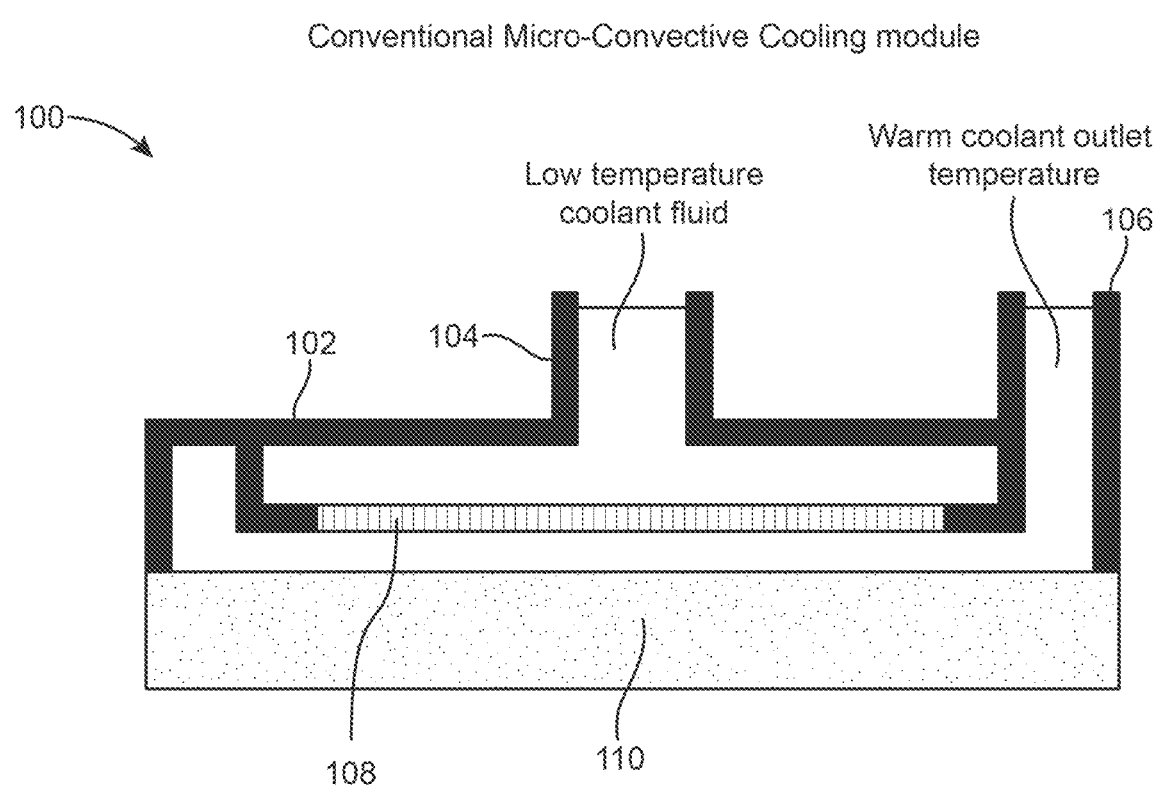
FIG. 1 shows a prior art cooling module in cross-section. The low temperature inlet coolant has access to the entire jet plate and is accelerated through the jet plate towards the surface to be cooled (direct module) or the base plate (indirect module). The coolant, increased in temperature through heat transfer, is collected and flows to the outlet.

Reference will now be made in detail to the preferred embodiments of the invention, examples of which are illustrated in the accompanying drawings. Notably, the figures and examples below are not meant to limit the scope of the present invention or its embodiments or equivalents. For purposes of this detailed discussion, unless specifically stated otherwise, the terms "section" and "segment" are used interchangeably, and therefore may be considered to have the same meanings.

Overview of the Present Invention

The invention uses the geometric structures of the jet plate, the ceiling and the base plate to divide the internal chambers of the cooling module into sections so that the flow passes through at least two sections in series where the discharge from one or more sections is routed to the inlet of a subsequent section within the cooling module. By causing the same coolant fluid to be put in contact with the cooling surface (base plate cooling surface or heat source) multiple times, the flow rate consumption of the cooling module is significantly reduced. By not permitting the coolant fluid to leave the external seal boundary of the cooling module to re-chill and recirculate it, the number of external seals required is reduced and the total pressure drop of the recirculating cooling module is reduced because the flow path is more compact.

Many internal manifolding possibilities exist to implement the invention in the framework of both direct and indirect cooling modules. The flow passage that collects the effluent from one section of the cold plate and routes it to the inlet side of the following section is referred to as the couch passage. The couch passage serves to isolate the effluent area of the originating jet plate section from the effluent section of any downstream jet plate sections. The couch passage may also be sealed to prevent coolant fluid flowing past the next jet plate section. The couch passage is formed using a combination of surfaces associated with other internal elements of the cooling module. Thus, the couch passage may be formed, for example, from the walls and structures of:

A) The jet plate (possibly with cutouts), the ceiling, and the base plate.
B) The jet plate (possibly with cutouts), the interstitial plate, and the base plate.
C) The jet plate (possibly with cutouts), the housing, and the interstitial plate.
D) The jet plate (possibly with cutouts), and the interstitial plate.
E) The jet plate (possibly with cutouts), boundaries extending from the ceiling, the interstitial plate and the base plate.

Each segment of the jet plate includes a micro-jet nozzle array configured to draw coolant fluid from an adjacent inlet plenum, and then accelerate the coolant fluid to flow at high velocity into and through an associated impingement volume beneath the jet plate so that the accelerated coolant fluid will impinge on a portion of cooling surface, which may comprise a cooling surface on the base plate of the cooling module or a cooling surface on the heat source, and thereby promote heat transfer from the heat source to the coolant fluid.

If present, the interstitial plate serves to aid in guiding the flow from the outlet of one segment to the inlet plenum of the next segment. Modern manufacturing technologies can allow the jet plate, the ceiling, or both, to be constructed as an integral component of the interstitial plate. Cooling performance may be improved by sealing the joints between the jet plate and the housing, the interstitial plate, the ceiling and/or the base plate using either a gasket, an adhesive, or a welding procedure.

The fastening system can be incorporated directly into the housing, meaning the housing has mounting holes that connect the cooling module to the heat source. The fastening system can also use a separate structure, sometimes referred to as a tensioner plate, which transmits the fastener mounting force from the board that the heat generating component is mounted to, to the housing.

Additional geometric structures (e.g., walls or boundaries) may be added to the direct cooling modules, the indirect cooling modules, or both, to assist in the formation of couch passages beneath the jet plate to help ensure flow does not short circuit between various effluent sections. The additional geometric structures tend to simplify the geometry needed for the base plate, thus reducing the cost of manufacture and assembly. An optional assembly of the cooling module and an implementation of the present invention in a cooling module can be facilitated by constructing the housing in two parts, the two parts being fastened, adhered, or welded together.

In addition, it may be beneficial to manufacture the multiple segments of the jet plate into separate pieces and have these separate pieces be held within the assembly, rather than using one contiguous jet plate.

Turning to the figures, FIG. 1 shows a prior art cooling module 100 in cross-section. As shown in FIG. 1, the prior art cooling module 100 typically comprises a housing 102, an inlet 104, an outlet 106 and a jet plate 108. The housing 102 is attached to the surface to be cooled 110. The low temperature coolant enters the inlet 104 and has access to the entire jet plate 108 and is accelerated through the jet plate 108 towards the surface to be cooled 110 (direct module) or the base plate (indirect module). The temperature of the coolant fluid increases due to the heat transfer resulting from the contact with the cooling surface 110. The coolant fluid is collected and flows to the outlet 106 to be discharged from the cooling module 100.

Figure 2A:
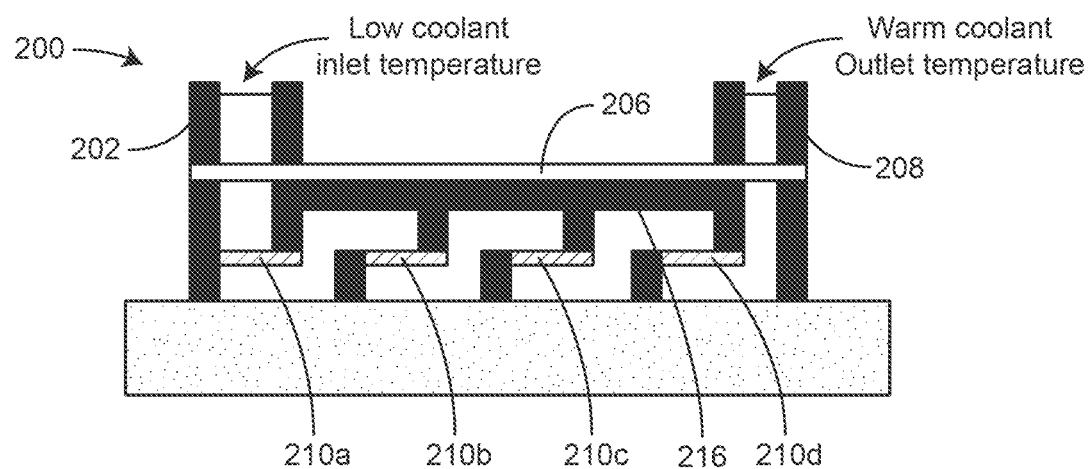
FIGS. 2A, 2B and 2C show an example of an internal recirculation cooling module in cross-section according to one embodiment of the current invention. In this example, the cooling module has four stages.
Figure 2B:
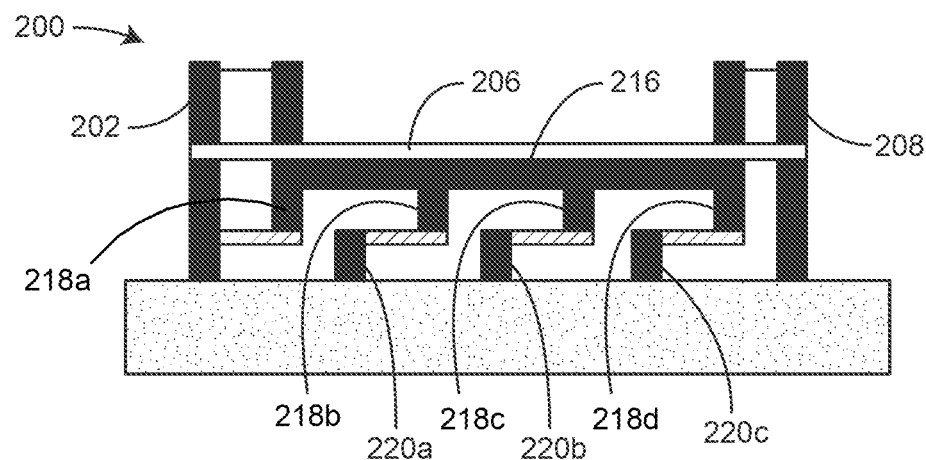
Figure 2C:
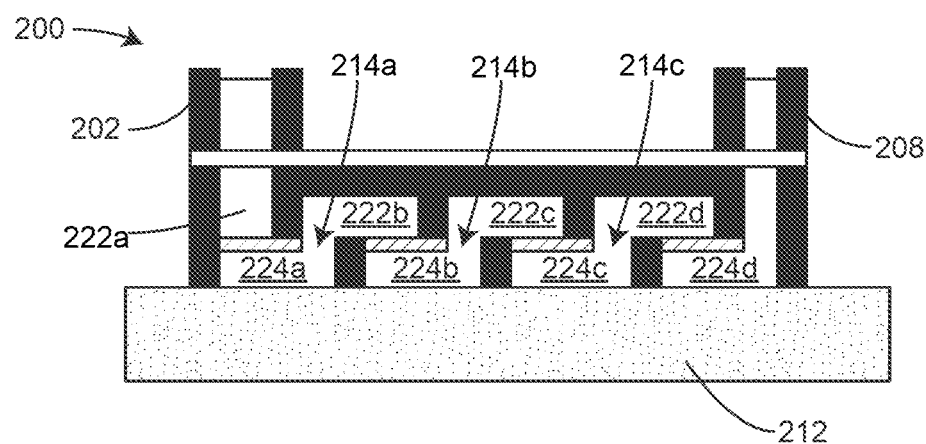

FIGS. 2A, 2B and 2C show an example of an internal recirculation cooling module 200 in cross-section according to one embodiment of the current invention. In this example, the cooling module 200 has four stages, meaning that the same coolant fluid is accelerated four separate times through four separate segments 210a-210d of a jet plate that each address a different area on the surface to be cooled 212. The surface to be cooled 212 may comprise a base plate in thermal contact with a surface of one or more heat-generating electronic devices, wherein the base plate is a component of the cooling module 200. In this configuration, the cooling module 200 is referred to as an "indirect" cooling module. Alternatively, the surface to be cooled 212 may comprise the heat-generating electronic device itself, in which case the cooling module 200 may be referred to as a "direct" cooling module.

As shown best in FIG. 2A, the cooling module 200 comprises an inlet port 202 connected to a housing 206, an outlet port 208 connected to the housing 206, and a segmented jet plate 210a-210d. The cooling module 200 also includes a ceiling 216 located on the inside of the top wall of the housing 206. As shown best in FIG. 2B, the ceiling 206 has a set of ceiling-mounted boundaries 218a-218d (i.e., walls) extending from the ceiling 216 down to the upper faces of each one of the different segments 210a-210d of the jet plate. If the cooling surface is a base plate (as in the indirect cooling version of the cooling module), then the cooling surface 212 has a set of cooling surface-mounted boundaries 220a-220d extending from the base plate 212 up to lower faces 222 of the jet plate 210a-210d.

The shapes, arrangement and relative positions of the jet plate segments 210a-210d, ceiling 216, ceiling mounted boundaries 218a-218c, the cooling surface 212 and the cooling surface-mounted boundaries 220a-220c altogether serve to define four inlet plenums 222a-222d located above the jet plate segments 210a-210d, four impingement volumes 224a-224d located below the jet plate segments 210a-210d, and three couch passages 214a-214c. See FIG. 2C. The couch passages 214a-214c are configured to fluidly connect the exits of impingement volumes 224a-224c to the entries of inlet plenum 222b-222d in the cooling module 200, so that cooling fluid that has already entered the impingement volumes 224a-224c to impinge on different portions of the cooling surface 212 will next be routed to the inlet plenums 222b-222d, where the coolant fluid will be drawn into and accelerated by subsequent micro-jet arrays in the jet plate segments 210b-210d.

Figure 3:
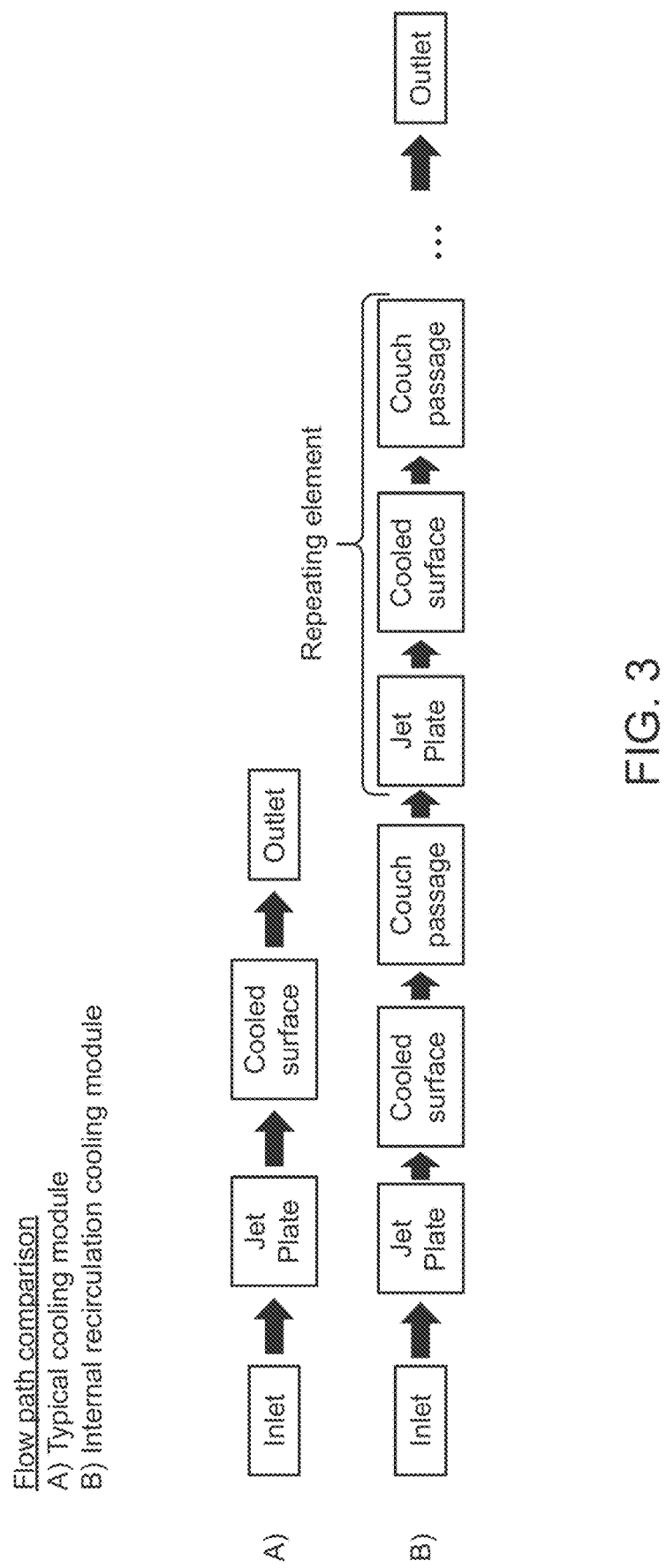
FIG. 3 shows how the flow path (A) for a conventional, prior art cooling module differs from the flow path (B) of a cooling module equipped with internal recirculation according to embodiments of the present invention.

FIG. 3 shows how the flow path (A) for a conventional, prior art cooling module differs from the flow path (B) of a cooling module equipped with internal recirculation according to embodiments of the present invention. The couch passages link the impingement volumes below each segment of the jet plate with the inlet plenums of the subsequent sections of jet plate. Although it may be more efficient to form the couch passages by controlling by the shapes, arrangement, and relative positions of the boundaries extending from the ceiling and the cooling surface in the cooling module, it is to be understood that, in alternative embodiments of the present invention, the couch passages may comprise physical tubes or conduits (independent from the boundaries extending from the ceiling and cooling surface).

Figure 4:
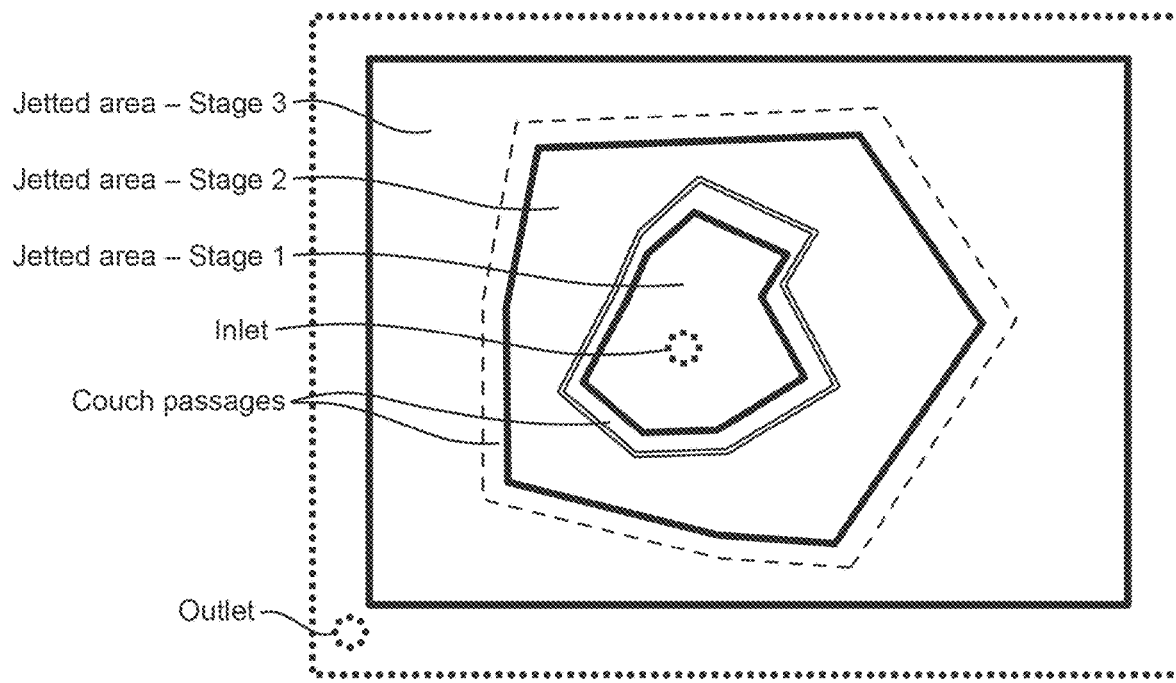
FIG. 4 shows that the segmentation of the sections of jet plate within a given cooling module can be arbitrary.

FIG. 4 illustrates that the apportioning of the segments of jet plate within a given cooling module can be arbitrary. Here, a central inlet is connected from a central jet plate section to subsequent ring-like segments to an annular outlet collection passage and finally to an outlet.

Figure 5:
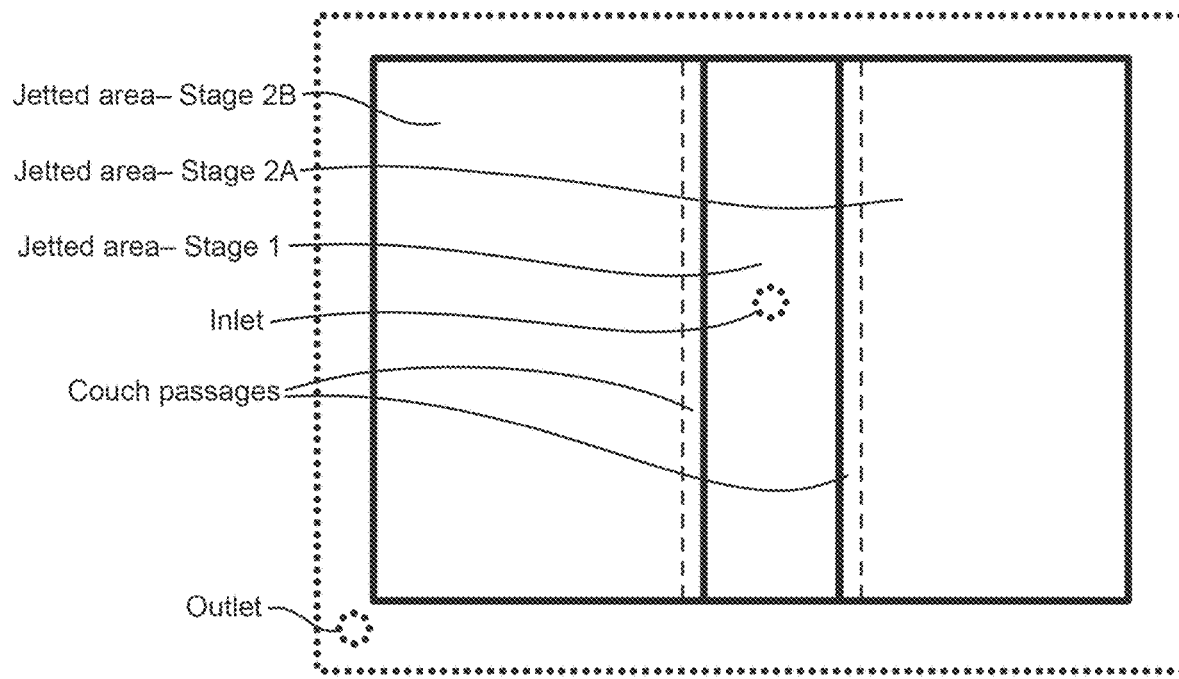
FIG. 5 shows a schematic representation of a surface segmentation where the initial central impingement area is connected to two separate subsequent jet plate sections, both of which route their effluent into a common annular collection passage to flow to the outlet.

FIG. 5 shows a schematic representation of a surface apportioning where the initial central impingement area is connected to two separate subsequent jet plate sections which then both route their effluent into a common annular collection passage to route flow to the outlet. The schematic shows that not all jet plate sections must be connected in series.

Figures 6A, 6B:
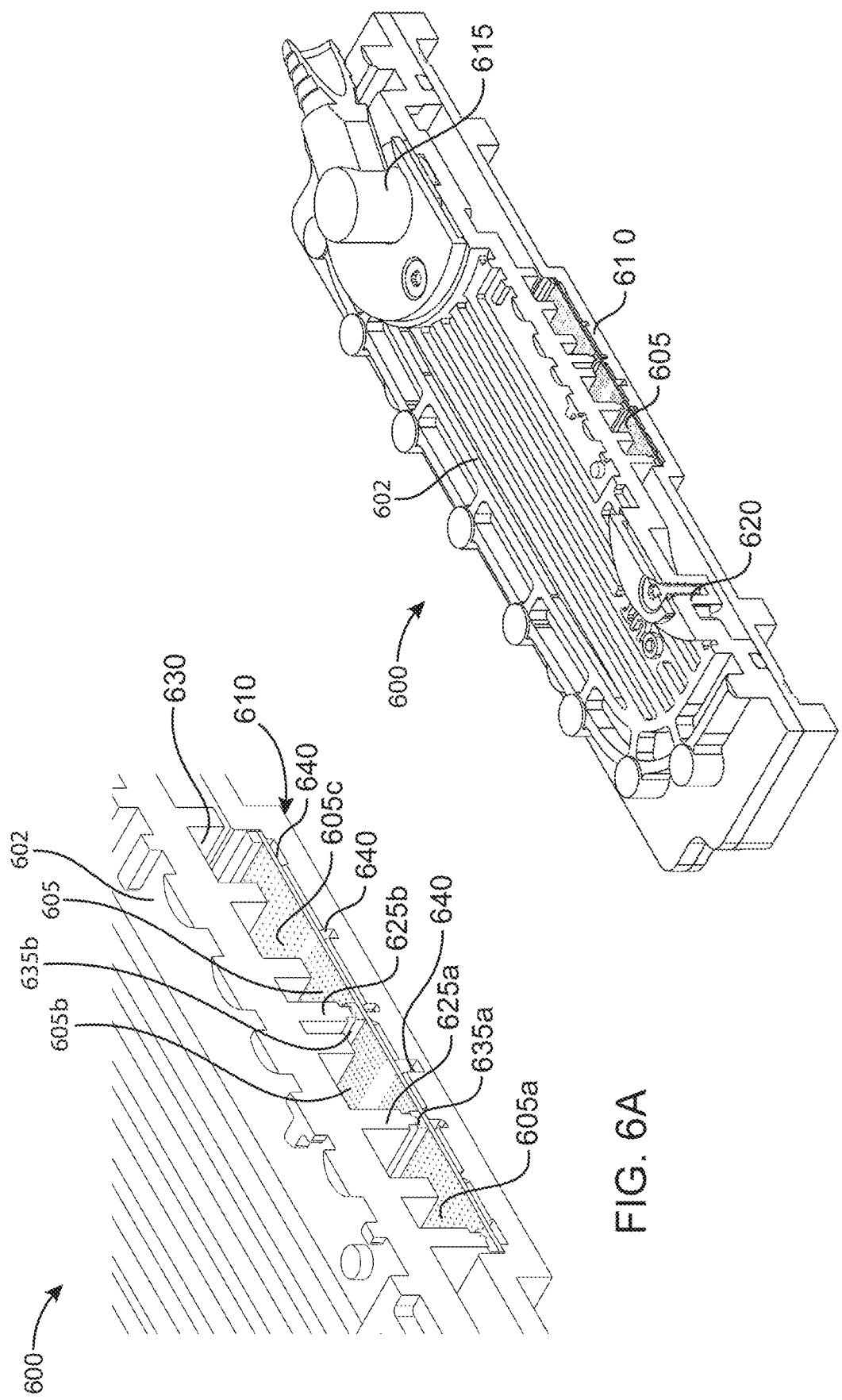
FIGS. 6A and 6B show isometric cross-sectional views of an indirect cooling module 600 with internal recirculation constructed according to one embodiment of the present invention (Example A).

FIGS. 6A and 6B show isometric cross-sectional views of an indirect cooling module 600 with internal recirculation constructed according to one embodiment of the present invention (Example A). The cooling module 600 has a housing 602, a jet plate 605, a base plate 610, an inlet 615 and an outlet 620. The jet plate 605 is apportioned into three separate segments 605a-605c. These three segments 605a-605c are isolated from each other by two ceiling-mounted boundaries 625a and 625b extending from the ceiling 630 on the inside top wall of the housing 602. Suitably, seals 635a and 635b are located where the ceiling-mounted boundaries 625a and 625b join the jet plate 605 to prevent coolant fluid from one segment to flow directly into another segment without flowing through the jet plate or couch passages (shown best in FIGS. 7 and 12, discussed in more detail below) formed by the shapes, arrangements and relative positions of the jet plate 605, base plate 610, ceiling 630 and ceiling-mounted boundaries 625a and 625b. Effluent collection passages 640 ensure that coolant fluid that has already passed through micro-jet nozzle arrays in the jet plate segments 605a, 605b and 605c get funneled into the couch passages and/or outlet of the cooling module 600.

Figure 7:
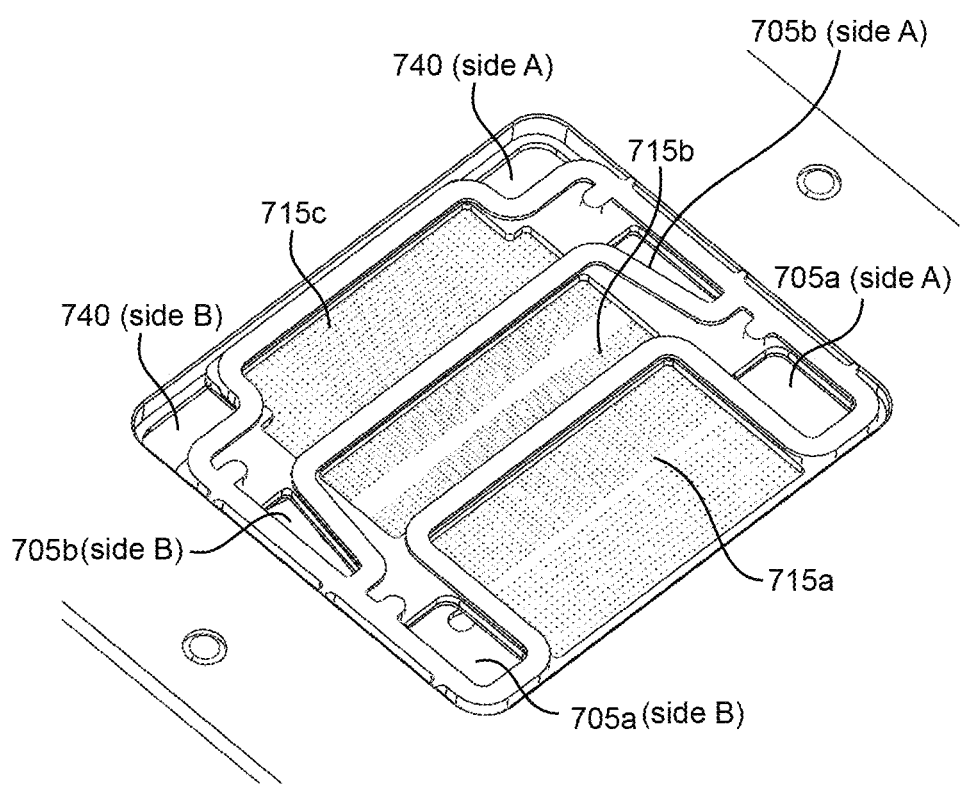
FIG. 7 shows the same cooling module (Example A) with housing removed to better identify the couch passages between the impingement volumes of each jet plate section and the inlet side of the downstream section. For this example, the couch passages repeat on two ends of the cooling module (A and B).

FIG. 7 shows the same cooling module 600 illustrated in FIG. 6 (Example A), but with housing 602 removed to show and identify the couch passages 705a and 705b fluidly connected to impingement volumes below each one of the micro-jet nozzle arrays 715a, 715b and 715c of each one of the three jet plate segments and the inlet plenums associated with the micro-jet nozzle arrays in downstream jet plate segments. For this example, there are two couch passages on each side (side A and side B) of each one of the micro-jet arrays in the jet plate segments of the cooling module. As shown in FIG. 7, two couch passages 705a (side A and side B) are configured to capture and guide coolant fluid (not shown in FIG. 7) that has undergone a first impingement by operation of the first micro-jet nozzle array 715a in a first segment of the jet plate. Two couch passages 705b (side A and side B) are configured to capture and guide coolant fluid that has undergone a second impingement by operation of the second micro-jet nozzle array 715b in a second segment of the jet plate. And two effluent channels 740 (side A and side B) capture and guide coolant fluid that has undergone a third impingement by operation of the third micro-jet nozzle array 715c in a third segment of the jet plate.

Couch passages 705a guide coolant fluid from an impingement volume (not shown in FIG. 7, but shown in FIG. 2) located below micro-jet nozzle array 715a into an inlet plenum (also not shown in FIG. 7, but illustrated in FIG. 2) located above micro-jet nozzle array 715b. Couch passages 705b route coolant fluid from an impingement volume located below micro-jet nozzle array 715b to an inlet plenum located above micro-jet nozzle array 715c. And effluent collection channels 740 are configured to route coolant fluid from an impingement volume located below micro-jet nozzle array 715c toward an outlet in the cooling module 700.

Figure 8:
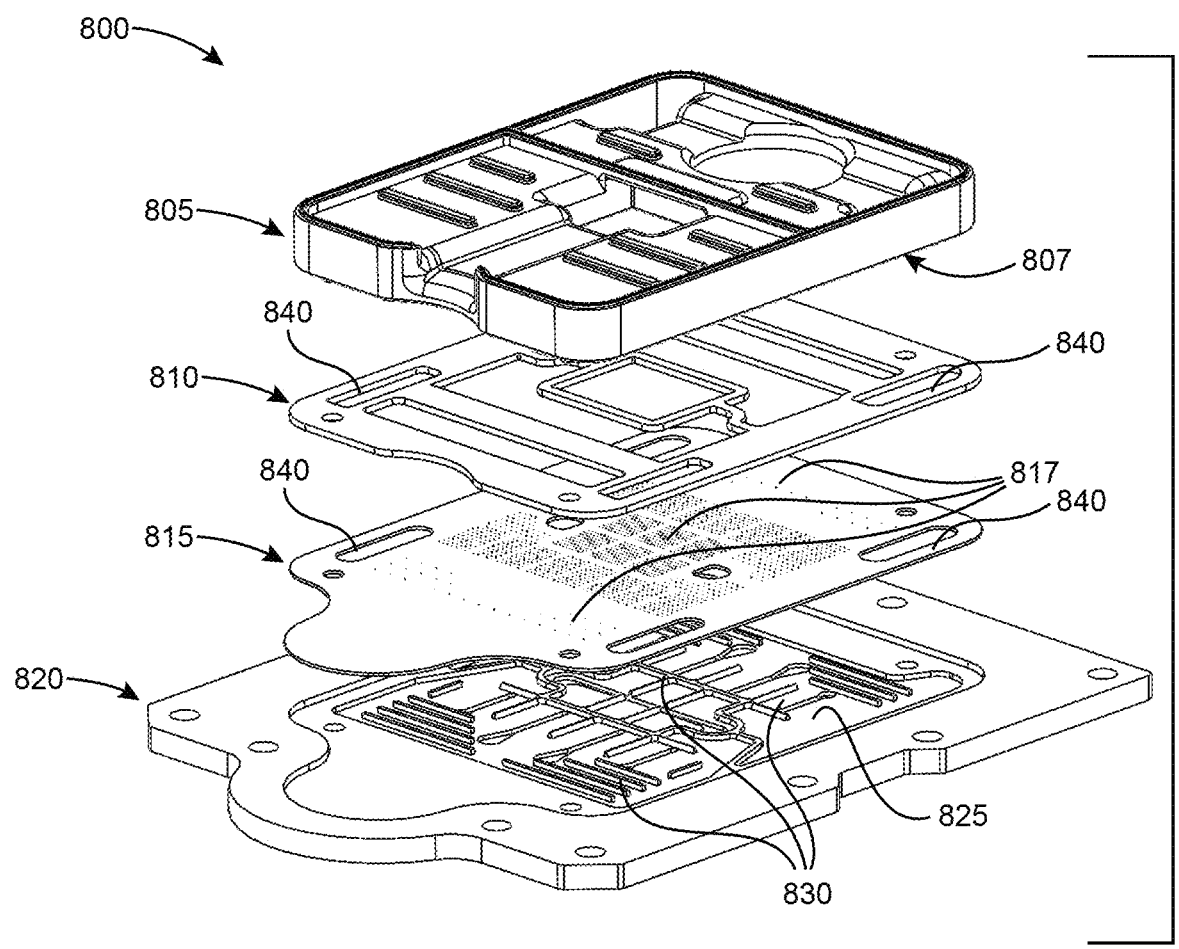
FIG. 8 shows an exploded view of another example (Example B) of a cooling module constructed according to another embodiment of the present invention, with the housing removed in order to better illustrate some of the internal components.

FIG. 8 shows an exploded view of another example (Example B) of a cooling module 800 constructed according to another embodiment of the present invention, with the housing removed in order to better illustrate some of the internal components. In this embodiment, an interstitial plate 805 and a sealing gasket 810 are inserted between the jet plate 815 and the housing (not shown). The jet plate 815 is segmented into three segments, each segment containing an array of micro-jet nozzles 817. After the coolant fluid has passed through the first and second micro-jet nozzle arrays to impinge on the cooling surface 825 of the base plate 820, the coolant fluid will be located in impingement volumes existing below the plane of the segmented jet plate 815. The couch passages (shown best in FIGS. 7 and 12) are used to move the coolant fluid out of the impingement volumes that lie below the plane of the segmented jet plate 815 and into the inlet plenums that lie above the plane of the segmented jet plate 815. Therefore, it is necessary that the couch passages be configured to "elevate" the coolant fluid from a level below the plane of the segmented jet plate 815 to a level located above the plane of the segmented jet plate 815 as it moves the coolant fluid from an impingement volume to a downstream inlet plenum. So at least some parts of the couch passages will exist below the plane of the segmented jet plate 815, while other parts of the couch passages will exist above the plane of the segmented jet plate 815.

The creation of the couch passages in the cooling module 800 may be facilitated by the insertion and use of the interstitial plate 805, which includes a ceiling 807 on the underside of the interstitial plate 805, the ceiling 807 having downward-extending ceiling-mounted boundaries (and/or walls or standoffs). These ceiling-mounted boundaries, in combination with the structures of the upper face of the segmented jet plate 815 and the ceiling 807 are conveniently used to form the parts of the couch passages existing above the plane of the segmented jet plate 815. In some embodiments, the ceiling 807 is an integral part of the interstitial plate 805. When there is no interstitial plate used, the features of the ceiling 807 may be formed on the inside top wall of the housing. In still other embodiments, the ceiling 807 may comprise a separately manufactured piece that may be inserted below the interstitial plate 805 or the inside top wall of the housing. The base plate 820 includes a cooling surface 825 that has upward-extending cooling surface-mounted boundaries 830 that are suitably shaped and arranged to cooperate with the structures of the lower face of the segmented jet plate 815 and the cooling surface 825 to form the parts of the couch passages existing below the plane of the segmented jet plate 815.

The sealing gasket 810 prevents the cooling fluid in one segment of the segmented jet plate 815 from flowing directly into a different segment of the segmented jet plate 815 without passing through the couch passages. Cutouts 840 in the segmented jet plate 815 and the corresponding parts of the sealing gasket 810 are part of the couch passages that allow coolant to pass through the plane of the segmented jet plate 815 while it is elevating the coolant fluid from the level below the plane of the segmented jet plate 815 to the level above the plane of the segmented jet plate 815.

Figure 9:
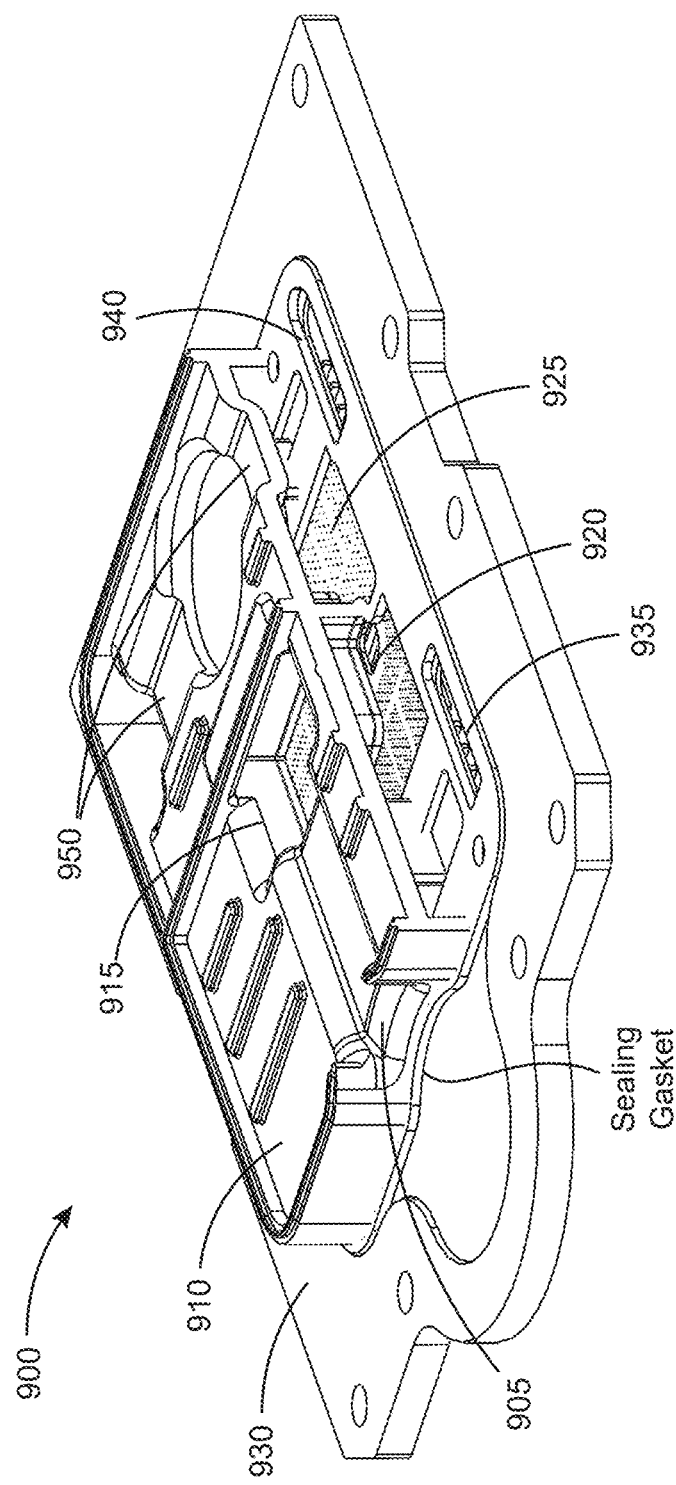
FIG. 9 shows a partial section view of the cooling module 900 (Example B) shown in the exploded view of FIG. 8.

FIG. 9 shows a partial section view of the cooling module 900 (Example B) shown in the exploded view of FIG. 8. In this case, an inlet flow channel 905 cut into the top of the interstitial plate 910 routes cooling fluid from an inlet port on the housing (not shown) to roughly the center 915 of the cooling module 900. A first couch passage, which routes the coolant fluid back towards the inlet side of the segmented jet plate 920 prior to it flowing through the nozzle array in the second segment of the jet plate 925, is formed by the combination of structures associated with boundaries in the base plate 930, the segmented jet plate 925, and the interstitial plate 910. A second couch passage 935, which routes coolant fluid from the second segment of the segmented jet plate 925 to a third segment is also formed by boundaries in the base plate 930, the jet plate 925, and the interstitial plate 910, where it impinges in the third section before being collected in an effluent collection passage 940 within the interstitial plate 910 and then allowed to flow to an outlet port (not shown) via a couple of external flow channels 950 located between the bottom side of the top wall of the housing and the top side of the interstitial plate 910.

Figure 10:
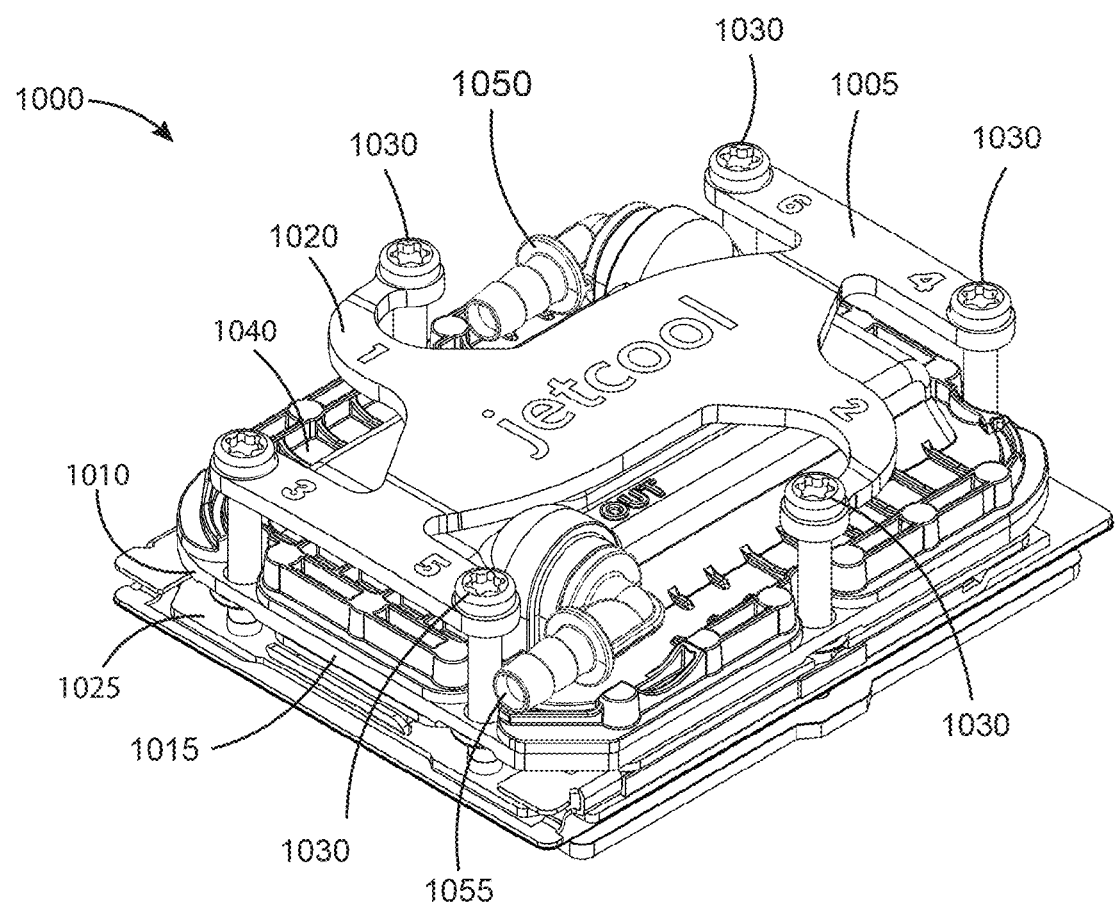
FIG. 10 shows a cooling module assembly constructed according to the invention described herein (Example C).

FIG. 10 shows a cooling module assembly 1000 (Example C) that uses a cooling module 1005 with internal recirculation constructed according to an embodiment of the present invention. In this example, the base plate 1010 of the cooling module 1005 is attached and secured to the surface to be cooled 1015 (a processor in this case) using a fastening system, which in this case comprises a tensioner plate 1020 that transmits compressive force from the processor mounting bracket 1025 (a bolster plate in this case) and the fasteners 1030 to the cooling module housing 1040. An inlet port 1050 attached to the housing 1040 is configured to admit pressurized coolant fluid produced by an external source into the cooling module 1005, and an outlet port 1055 attached to the housing 1040 is configured to discharge coolant fluid from the cooling module 1005. The base plate of the cooling module 1010 is in thermal communication with the surface to be cooled 1015 using a thermal interface material (not shown).

Figure 11:
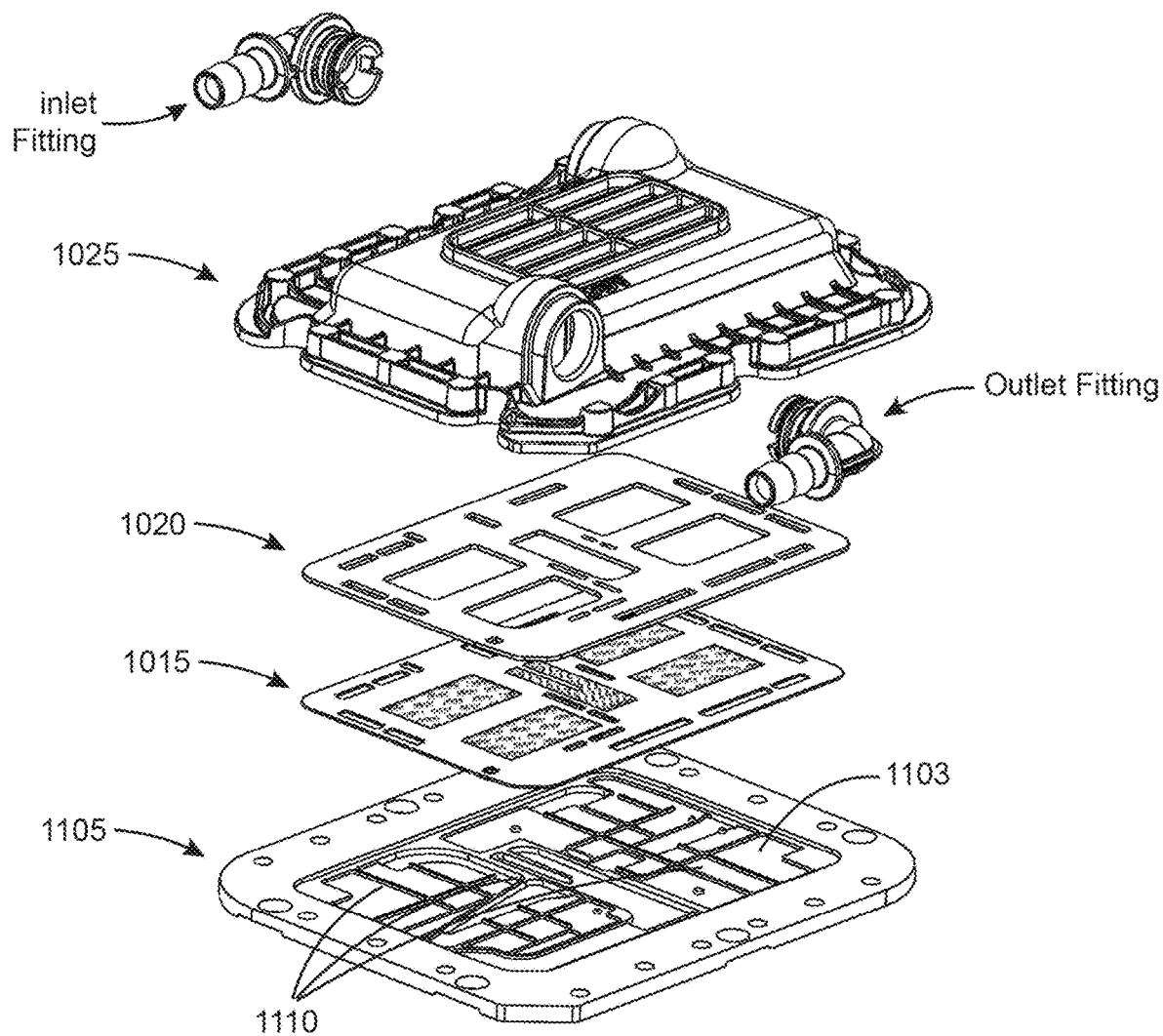
FIG. 11 shows an exploded view of Example C of an implementation of the present invention. The base plate contains a number of channel features to help form the couch passages together with the jet plate and housing.

FIG. 11 shows an exploded view of the cooling module assembly shown in FIG. 10. The cooling surface 1103 of the base plate 1105 contains a number of cooling surface-mounted boundaries 1110 (walls or standoffs or channeling features) that, together with structures and cutouts built into the jet plate 1015, the sealing gasket 1020 and the housing 1025, help form the appropriately configured couch passages for moving cooling fluid from one segment of the jet plate 1015 to the next segment.

Figure 12:
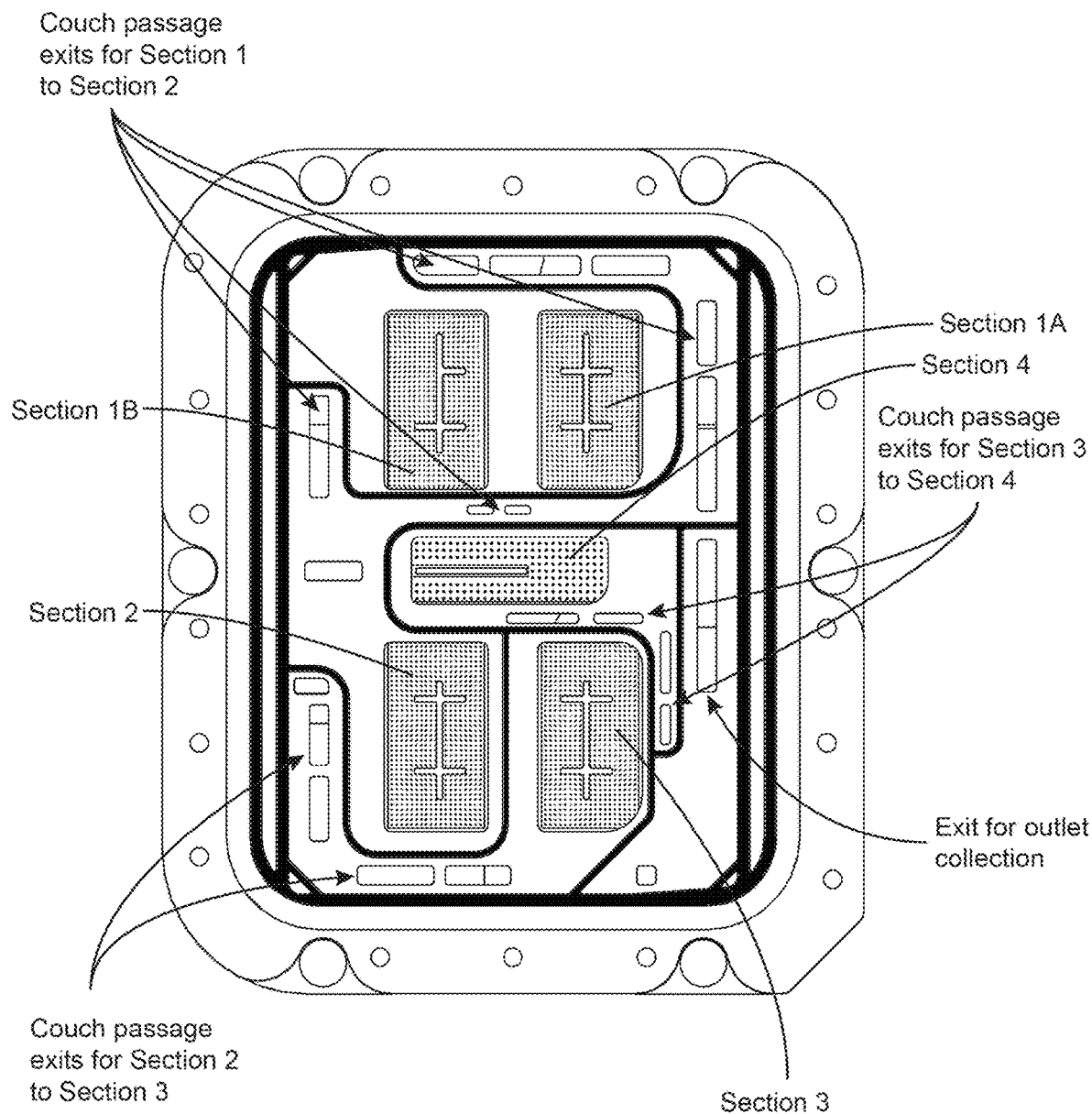
FIG. 12 shows a partial top view of the exemplary cooling module assembly shown in FIG. 10 (Example C).

FIG. 12 shows a partial top view of the exemplary cooling module assembly shown in FIG. 10. For ease of understanding, the housing, inlet port and outlet port have been removed from the image in the figure. As FIG. 12 shows, the inlet flow of coolant fluid is divided between two parallel sections of jet plate (Section 1A and Section 1B), each section containing a micro-jet nozzle array comprising a plurality of micro-jet nozzles. The discharge from these parallel sections is collected together through a number of couch passages to bring the coolant to Section 2. The couch passages of Section 2, route the flow to the top volume of fluid connected to the inlet plenum in Section 3. Section 3 in turn has couch passages connecting it to the fourth and final segment. Example C shows the ability to have parallel sections (1A and 1B) to be combined to lead to further serial sections (2, 3, 4). FIG. 12 also shows that the sections can be used to target specific areas of a processor chip to customize the heat transfer in each area.

Figure 13:
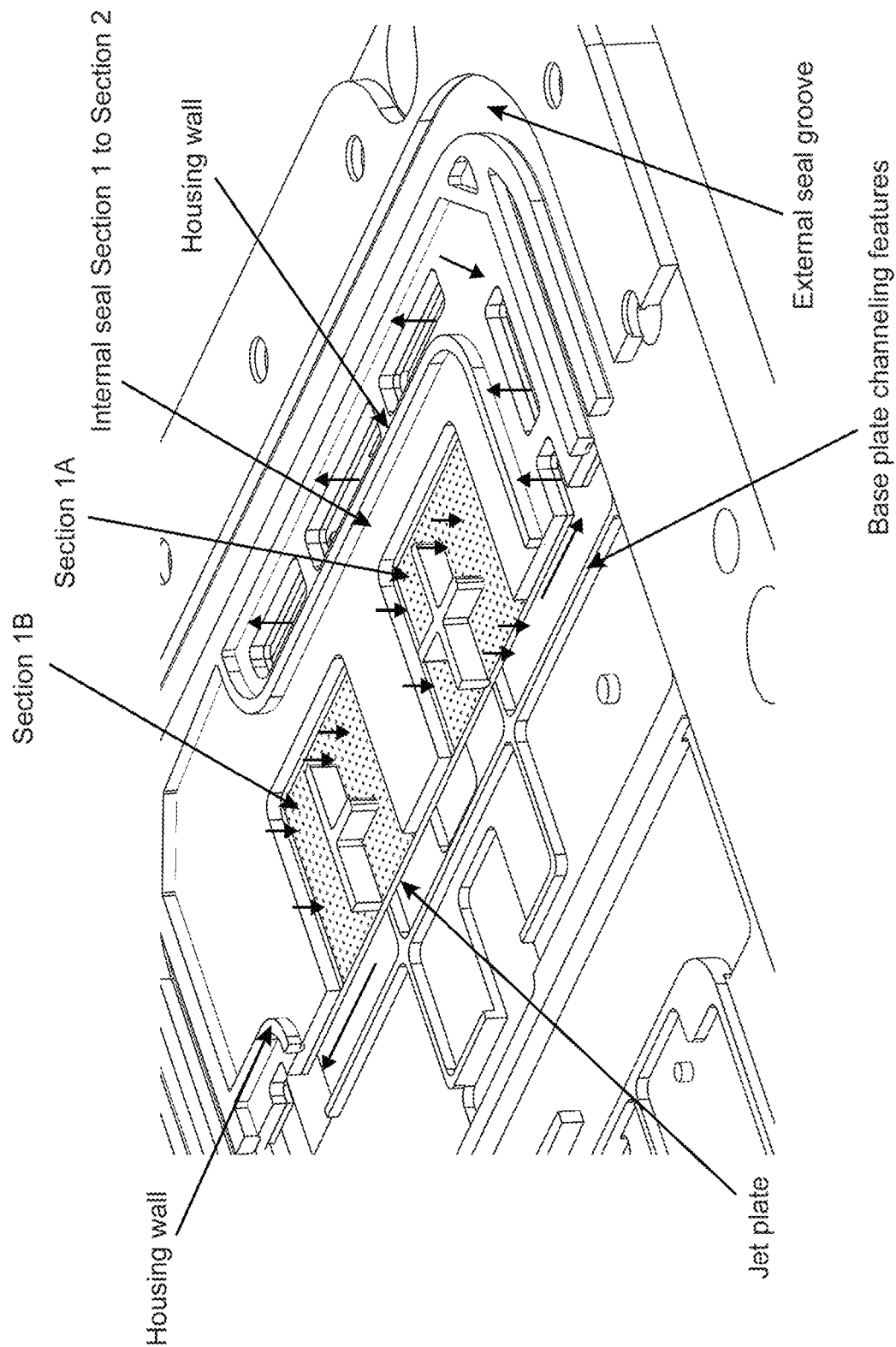
FIG. 13 further clarifies the flow path in the exemplary cooling module shown in FIGS. 10-12.

FIG. 13 further clarifies the flow path in the exemplary cooling module shown in FIGS. 10-12 by focusing on the couch passage formation from Sections 1A and 1B leading to Section 2. Notably, base plate channeling features, typically formed from copper, may be used to help form the couch passages. These positive features (sticking up from the copper) on the base plate, could also be achieved using a separate piece. The arrows in FIG. 13 illustrate the flow path taken by the coolant fluid traveling in the couch passage that connects the impingement volume of Section 1 to the inlet plenum of Section 2.

Figure 14:
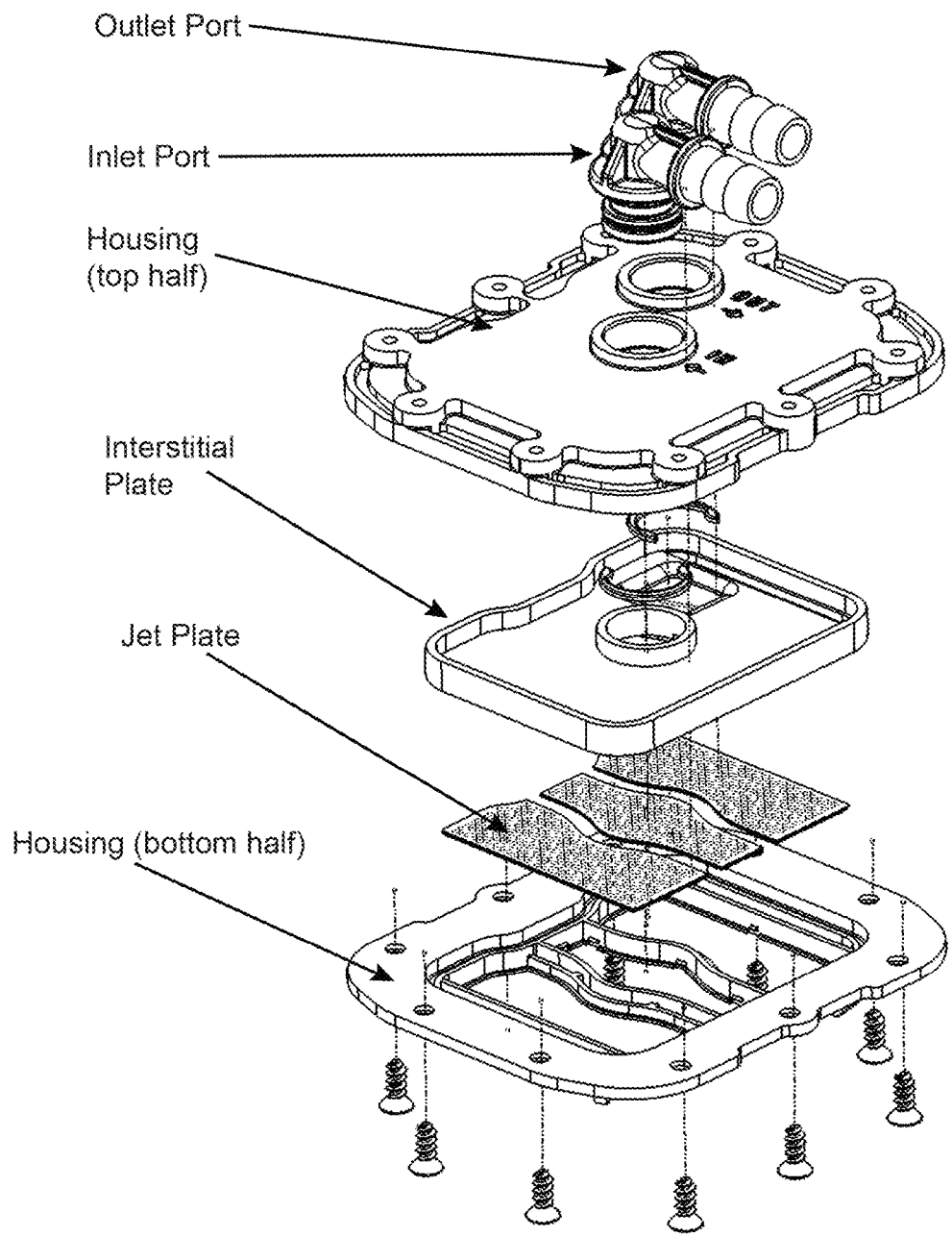
FIG. 14 shows an exploded view of another cooling module (Example D) constructed in accordance with an embodiment of the present invention. The cooling module shown mounts directly to the heat source and is therefore considered to be a direct (contact) cooling module.

FIG. 14 shows an exploded view of another cooling module (Example D) constructed in accordance with an embodiment of the present invention. The cooling module shown mounts directly to the heat source and is therefore considered to be a direct cooling module. In this case, the internal passages do not have gaskets. The jet plate comprises three separate sections manufactured as three separate physical pieces, in this instance.

Figure 15:
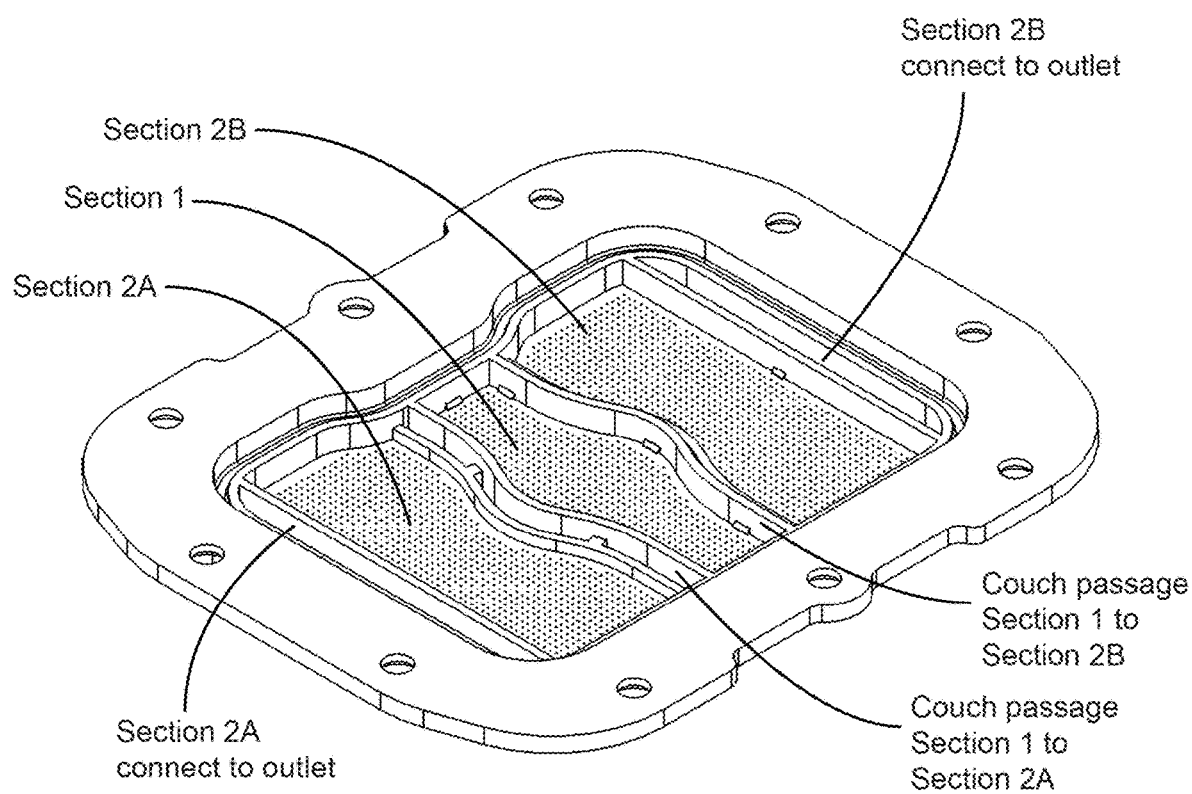
FIG. 15 shows the flow arrangement for the direct contact cooling module (Example D) shown in FIG. 14.

FIG. 15 shows the flow arrangement for the direct contact cooling module (Example D) shown in FIG. 14, and demonstrates how a single jet plate section connected to the inlet may be split into two parallel sections (Section 2A and Section 2B) before gathering the effluent from these sections together and transmitting the effluent to the outlet (not shown).

Figure 16A:
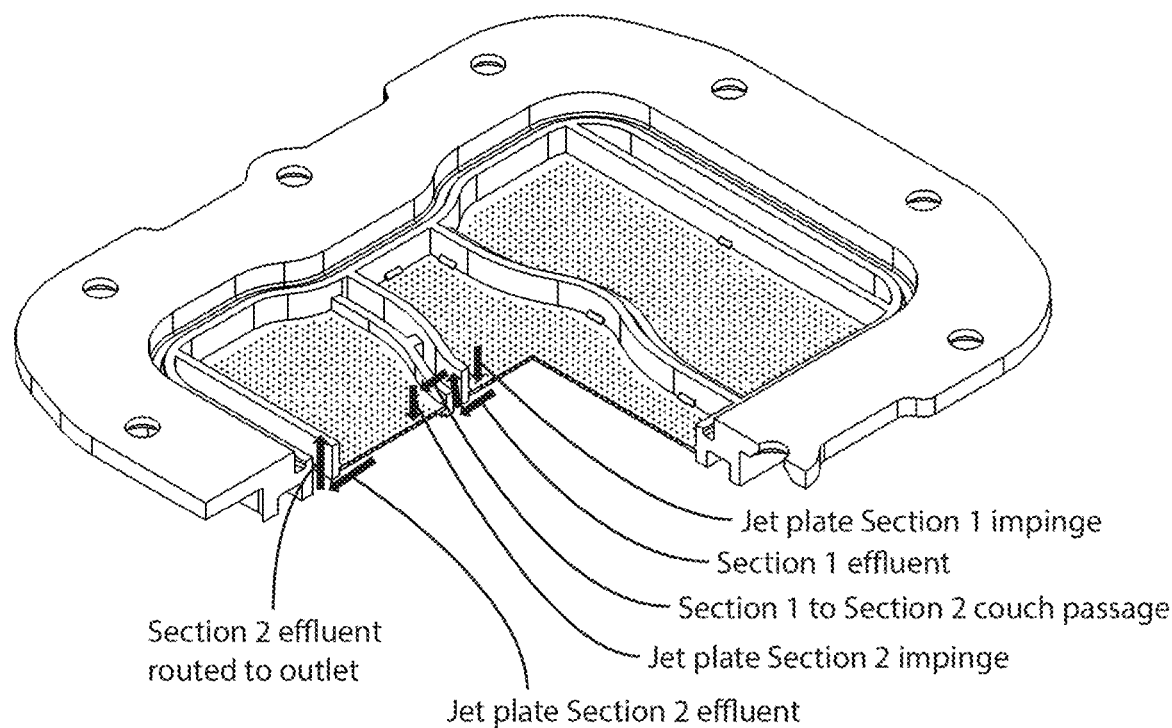
FIGS. 16A and 16B show partial sectional views of the direct contact cooling module (Example D) shown in FIG. 14.
Figure 16B:
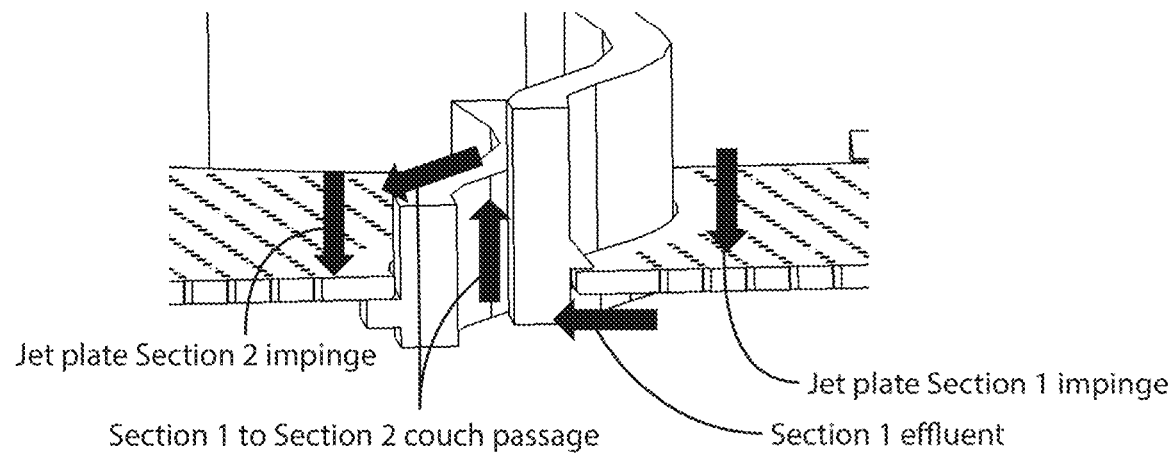

FIGS. 16A and 16B show partial sectional views of the direct contact cooling module (Example D) shown in FIG. 14. This sectional view illustrates in more detail the flow path from Section 1 to Section 2A. The couch passage in this case is formed by the jet plate, the lower half of the housing and the surface being cooled. FIG. 16 has an inset figure offering a close up of the flow path from Section 1 to Section 2A, through the couch passage.

The above-described preferred embodiments are intended to illustrate the principles of the invention, but not to limit its scope. Various other embodiments, modifications and equivalents to these preferred embodiments may occur to those skilled in the art upon reading the present disclosure or practicing the claimed invention. Such variations, modifications and equivalents are intended to come within the scope of the invention and the appended claims.

What is claimed is:

1. A cooling module, comprising:
 (a) a jet plate comprising an upper face, a lower face, a first segment that includes a first array of microjet nozzles extending through the jet plate from the upper face of the jet plate to the lower face of the jet plate, and a second segment that includes second array of microjet nozzles extending through the jet plate from the upper face of the jet plate to the lower face of the jet plate, and
 (b) a housing;
 (c) a ceiling disposed between the jet plate and the housing, the ceiling comprising a first ceiling-mounted boundary extending from the ceiling to the upper face of the jet plate and a second ceiling-mounted boundary extending from the ceiling to the upper face of the jet plate,
 (d) a base plate comprising a cooling surface, a first cooling surface-mounted boundary extending from the cooling surface to the lower face of the jet plate, and a second cooling surface-mounted boundary extending from the cooling surface to the lower face of the jet plate;
 (e) wherein the jet plate, the ceiling, the cooling surface of the base plate, the first ceiling-mounted boundary, the second ceiling-mounted boundary, the first cooling surface-mounted boundary and the second cooling surface-mounted boundary are all arranged to define a first inlet plenum located between the ceiling and the first array of microjet nozzles, a second inlet plenum located between the ceiling and the second array of microjet nozzles, a first impingement volume located between the first array of microjet nozzles and the cooling surface, a second impingement volume located between the second array of microjet nozzles and the cooling surface, and a first couch passage fluidly connecting the first impingement volume to the second inlet plenum;
 (f) a fastening system for attaching the cooling module to a circuit board having one or more heat-generating electronic components affixed thereto so that the cooling surface of the base plate will be in thermal communication with said one or more heat-generating electronic components on the circuit board and absorbs heat generated by said one or more heat-generating electronic components while the circuit board is in operation; and
 (g) an inlet fitting attached to the housing and configured to admit into the cooling module a pressurized coolant fluid transferred from an external source; and
 (h) an inlet flow channel to carry the pressurized liquid coolant fluid from the inlet fitting to the first inlet plenum;

(i) wherein,
  (i) the first array of microjet nozzles in the first segment of the jet plate is configured to receive the pressurized coolant fluid from the first inlet plenum, accelerate the pressurized coolant fluid and direct the accelerated and pressurized coolant fluid to flow into the first impingement volume at high velocity to strike a first portion of the cooling surface of the base plate, thereby removing the heat that the first portion of the cooling surface has absorbed from said one or more heat-generating electronic components,
  (ii) the couch passage is configured to carry some of the pressurized coolant fluid of the first impingement volume and into the second inlet plenum, and
  (iii) the second array of microjet nozzles in the jet plate is configured to receive the pressurized coolant fluid from the second inlet plenum, accelerate the pressurized coolant fluid and direct the accelerated and pressurized coolant fluid to flow into the second impingement volume at high velocity to strike a second portion of the cooling surface of the base plate, thereby removing the heat that the second portion of the cooling surface has absorbed from said one or more heat-generating electronic components.

2. The cooling module of claim 1, further comprising:
(a) an outlet fitting connected to the housing and configured to discharge pressurized coolant fluid from the cooling module;
(b) a first effluent collection passage configured to capture some of the pressurized coolant fluid from the first impingement volume and route the captured pressurized coolant fluid to the outlet fitting for discharge from the cooling module.

3. The cooling module of claim 1, further comprising a second effluent collection passage configured to capture some of the pressurized coolant fluid from the second impingement volume and route the captured pressurized coolant fluid to the outlet fitting for discharge from the cooling module.

4. The cooling module of claim 1, wherein the ceiling is manufactured as an integral component of the housing.

5. The cooling module of claim 1, wherein the ceiling is not manufactured as an integral component of the housing.

6. The cooling module of claim 5, further comprising:
(a) an interstitial plate disposed between the housing and the jet plate;
(b) wherein the ceiling is manufactured as an integral component of the interstitial plate.

7. The cooling module of claim 1, further comprising a sealing gasket that prevents pressurized coolant fluid entering the first segment of the jet plate from passing directly into the second segment of the jet plate without flowing through the first couch passage.

8. The cooling module of claim 1, wherein:
(a) the second segment of the jet plate surrounds and encloses the first segment of the jet plate;
(b) the second ceiling-mounted boundary of the ceiling surrounds and encloses the first ceiling-mounted boundary; and
(c) the second cooling surface-mounted boundary of the base plate surrounds and encloses the first cooling surface-mounted boundary.

9. The cooling module of claim 1, wherein:
(a) the jet plate further comprises a third segment that includes a third array of microjet nozzles extending through the jet plate from the upper face of the jet plate to the lower face of the jet plate;
(b) the ceiling further comprises a third ceiling-mounted boundary extending from the ceiling to the upper face of the jet plate; and
(c) the base plate further comprises a third cooling surface-mounted boundary extending from the cooling surface to the lower face of the jet plate;
(d) wherein the jet plate, the ceiling, the cooling surface of the base plate, the first ceiling-mounted boundary, the second ceiling-mounted boundary, the third ceiling mounted boundary, the first cooling surface-mounted boundary, the second cooling surface-mounted boundary and the third cooling surface-mounted boundary are all arranged to define a third inlet plenum located between the ceiling and the third array of microjet nozzles, a third impingement volume located between the cooling surface and the third array of microjet nozzles, and a second couch passage fluidly connects either the first impingement volume or the second impingement volume, or both, to the third inlet plenum; and
(e) the third array of microjet nozzles in the jet plate is configured to receive the pressurized coolant fluid from the third inlet plenum, accelerate the pressurized coolant fluid and direct the accelerated and pressurized coolant fluid to flow into the third impingement volume at high velocity to strike a third portion of the cooling surface of the base plate, thereby removing the heat that the third portion of the cooling surface has absorbed from said one or more heat-generating electronic components.

10. The cooling module of claim 9, further comprising:
(a) an outlet fitting connected to the housing and configured to discharge pressurized coolant fluid from the cooling module;
(b) a first effluent collection passage configured to capture some of the pressurized coolant fluid from the third impingement volume and route the captured pressurized coolant fluid to the outlet fitting for discharge from the cooling module.

11. The cooling module of claim 9, further comprising a sealing gasket that prevents pressurized coolant fluid entering the first segment of the jet plate from passing directly into the second segment of the jet plate without flowing through the second couch passage.

12. The cooling module of claim 11, wherein the sealing gasket prevents pressurized coolant fluid entering the second segment of the jet plate to flow directly into the third segment of the jet plate without flowing through the second couch passage.

13. The cooling module of claim 9, wherein:
(a) the third segment of the jet plate surrounds and encloses the first segment of the jet plate and the second segment of the jet plate;
(b) the third ceiling-mounted boundary of the ceiling surrounds and encloses the first ceiling-mounted boundary and the second ceiling-mounted boundary; and
(c) the third cooling surface-mounted boundary of the base plate surrounds and encloses the first cooling surface-mounted boundary and the second cooling surface-mounted boundary.

14. The cooling module of claim 9, wherein the ceiling is manufactured as an integral component of the housing.

15. The cooling module of claim 9, wherein the ceiling is not manufactured as an integral component of the housing.

16. The cooling module of claim 15, further comprising:
(a) an interstitial plate disposed between the housing and the jet plate;
(b) wherein the ceiling is manufactured as an integral component of the interstitial plate.

17. The cooling module of claim 1, further comprising:
(a) a second jet plate comprising another upper face, another lower face and a third segment that includes a third array of microjet nozzles extending through the second jet plate from said another upper face of the second jet plate to said another lower face of the second jet plate;
(b) wherein,
  (i) the ceiling further comprises a third ceiling-mounted boundary extending from the ceiling to said another upper face of the second jet plate, and
  (ii) the base plate further comprises a third cooling surface-mounted boundary extending from the cooling surface to said another lower face of the second jet plate,
  (iii) wherein the second jet plate, the ceiling, the cooling surface of the base plate, the first ceiling-mounted boundary, the second ceiling-mounted boundary, the third ceiling mounted boundary, the first cooling surface-mounted boundary, the second cooling surface-mounted boundary and the third cooling surface-mounted boundary are all arranged to define a third inlet plenum located between the ceiling and the third array of microjet nozzles, a third impingement volume located between the cooling surface and the third array of microjet nozzles, and a second couch passage that fluidly connects the first impingement volume or the second impingement volume, or both, to the third inlet plenum, and
  (iv) the third array of microjet nozzles in the second jet plate is configured to receive the pressurized coolant fluid from the third inlet plenum, accelerate the pressurized coolant fluid and direct the accelerated and pressurized coolant fluid to flow into the third impingement volume at high velocity to strike a third portion of the cooling surface of the base plate, thereby removing some of the heat that the third portion of the cooling surface has absorbed from said one or more heat-generating electronic components.

18. A method for cooling one or more heat-generating electronic components attached to a circuit board, the method comprising the steps of:
(a) providing a cooling module comprising a jet plate, a housing, a ceiling disposed between the jet plate and the housing, a base plate having a cooling surface, and a fastening system for fastening the cooling module to the circuit board;
(b) wherein (i) the jet plate comprises a first segment that includes a first array of microjet nozzles extending through the jet plate, and a second segment that includes a second array of microjet nozzles extending through the jet plate, and (ii) the jet plate, the ceiling, the cooling surface of the base plate, the first ceiling-mounted boundary, the second ceiling-mounted boundary, the first cooling surface-mounted boundary and the second cooling surface-mounted boundary are all arranged to define a first inlet plenum located between the ceiling and the first array of microjet nozzles, a second inlet plenum located between the ceiling and the second array of microjet nozzles, a first impingement volume located between the first array of microjet nozzles and the cooling surface, a second impingement volume located between the second array of microjet nozzles and the cooling surface, and a first couch passage fluidly connecting the first impingement volume to the second inlet plenum;
(c) with the fastening system, attaching the cooling module to the circuit board so that the cooling surface of the base plate will be in thermal communication with said one or more heat-generating electronic components on the circuit board and absorbs heat generated by said one or more heat-generating electronic components while the circuit board is in operation;
(d) connecting an external source for pressurized coolant fluid to an inlet port on the housing of the cooling module;
(e) transmitting pressurized coolant fluid received at the inlet port into the first inlet plenum of the jet plate;
(f) with the first array of microjet nozzles in the first segment of the jet plate, receiving the pressurized cooling fluid from the first inlet plenum, accelerating the pressurized coolant fluid and directing the accelerated and pressurized coolant fluid to flow into the first impingement volume at high velocity to strike a first portion of the cooling surface of the base plate, thereby removing the heat that the first portion of the cooling surface has absorbed from said one or more heat-generating electronic components;
(g) with the couch passage, transmitting some of the pressurized coolant fluid that struck the first portion of the cooling surface from the first impingement volume to the second inlet plenum; and
(h) with the second array of microjet nozzles in the jet plate, receiving the pressurized coolant fluid from the second inlet plenum, accelerating the pressurized coolant fluid and directing the accelerated and pressurized coolant fluid to flow into the second impingement volume at high velocity to strike a second portion of the cooling surface of the base plate without permitting the pressurized coolant fluid to exit the cooling module before entering the second inlet plenum, thereby removing the heat that the second portion of the cooling surface has absorbed from said one or more heat-generating electronic components.

19. The method of claim 18, further comprising the steps of:
(a) capturing some of the pressurized coolant fluid in the first impingement volume that the couch passage does not transmit to the second inlet plenum;
(b) routing the captured pressurized coolant fluid to an outlet fitting connected to the housing; and
(c) discharging the pressurized cooling fluid from the cooling module.

20. The method of claim 18, wherein the ceiling is manufactured as an integral component of the housing.

21. The method of claim 18, wherein the ceiling is not manufactured as an integral component of the housing.

* * * * *